(12) United States Patent
Mathe

(10) Patent No.: US 6,243,430 B1
(45) Date of Patent: Jun. 5, 2001

(54) NOISE CANCELLATION CIRCUIT IN A QUADRATURE DOWNCONVERTER

(75) Inventor: Lennart Karl-Axel Mathe, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/005,355

(22) Filed: Jan. 9, 1998

(51) Int. Cl.[7] ................................. H04B 1/10; H04L 1/00
(52) U.S. Cl. ........................... 375/346; 375/350; 455/296
(58) Field of Search ...................................... 375/346, 350, 375/261, 279, 280, 281, 284, 322, 329, 332; 329/304, 306; 327/551, 552, 557, 558; 455/296, 307, 309, 311, 312

(56) References Cited

U.S. PATENT DOCUMENTS

| | | | |
|---|---|---|---|
| 4,270,027 | * 5/1981 | Agrawal et al. | 379/339 |
| 5,061,928 | * 10/1991 | Karema et al. | 341/143 |
| 5,283,578 | * 2/1994 | Ribner et al. | 341/143 |
| 5,442,353 | * 8/1995 | Jackson | 341/143 |
| 5,454,007 | * 9/1995 | Dutta | 375/322 |
| 5,504,455 | * 4/1996 | Inkol | 329/304 |

FOREIGN PATENT DOCUMENTS 0650261    10/1994    (EP) ................................. H03M/3/02

OTHER PUBLICATIONS

Frerking, Marvin E.; Digital Signal Processing in Communication Systems; Kluwer Academic Publishers; 1994; pp. 174–182, 332.*

* cited by examiner

Primary Examiner—Stephen Chin
Assistant Examiner—Betsy L. Deppe
(74) Attorney, Agent, or Firm—Philip R. Wadsworth; Charles D. Brown; Christopher O. Edwards

(57) ABSTRACT

A noise cancellation circuit and quadrature downconverter for used in conjunction with a bandpass receiver. The noise cancellation uses at least one bandpass decimator and a summer. The output from each loop of a sigma-delta analog-to-digital converter ($\tau\Delta$ ADC) is provided to a respective bandpass decimator. Each bandpass decimator uses an error cancellation filter, a bandpass filter, and a decimator. The transfer functions of the error cancellation filter and bandpass filter are convolved to provide the transfer function of the bandpass decimator. The filtered signal is then decimated by N. The decimation by N can be incorporated within the bandpass decimator such that the bandpass decimator operates at 1/N of the frequency of the ADC sampling clock. The signals from all bandpass decimators are summed together and the resultant IF samples are provided to two multipliers which downconvert the IF samples to I and Q baseband samples with an inphase and a quadrature sinusoid, respectively. The baseband samples are lowpass filtered to further remove quantization noise and undesirable signals. The center frequency of the analog input signal, the ADC sampling clock, and the decimation by N can be selected such that an image of the input signal appears at $0.25 f_s$, where $f_s$ is the sample rate of the decimated samples.

26 Claims, 12 Drawing Sheets

NOISE CANCELLATION CIRCUIT IN A QUADRATURE DOWNCONVERTER

BACKGROUND OF THE INVENTION

I. Field of the Invention

The present invention relates to communications. More particularly, the present invention relates to a novel and improved noise cancellation circuit and quadrature downconverter.

II. Description of the Related Art

In many modern communication systems, digital transmission is utilized because of improved efficiency and the ability to detect and correct transmission errors. Exemplary digital transmission formats include binary phase shift keying (BPSK), quaternary phase shift keying (QPSK), offset quaternary phase shift keying (OQPSK), m-ary phase shift keying (m-PSK), and quadrature amplitude modulation (QAM). Exemplary communication systems which utilize digital transmission include code division multiple access (CDMA) communication systems and high definition television (HDTV) systems. The use of CDMA techniques in a multiple access communication system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS", and U.S. Pat. No. 5,103,459, entitled "SYSTEM AND METHOD FOR GENERATING WAVEFORMS IN A CDMA CELLULAR TELEPHONE SYSTEM", both assigned to the assignee of the present invention and incorporated by reference herein. An exemplary HDTV system is disclosed in U.S. Pat. No. 5,452,104, U.S. Pat. No. 5,107,345, and U.S. Pat. No. 5,021,891, all three entitled "ADAPTIVE BLOCK SIZE IMAGE COMPRESSION METHOD AND SYSTEM", and U.S. Pat. No. 5,576,767, entitled "INTERFRAME VIDEO ENCODING AND DECODING SYSTEM", all four patents are assigned to the assignee of the present invention and incorporated by reference herein.

In the CDMA system, a base station communicates with one or more remote stations. The base station is typically located at a fixed location. Thus, power consumption is less important consideration in the design of the base station. The remote stations are typically consumer units which are produced in high quantity. Thus, cost and reliability are important design considerations because of the number of units produced. Furthermore, in some applications such as a CDMA mobile communication system, power consumption is critical because of the portable nature of the remote station. Tradeoffs between performance, cost, and power consumption are usually made in the design of the remote stations.

In digital transmission, the digitized data is used to modulated a carrier sinusoid using one of the formats listed above. The modulated waveform is further processed (e.g. filtered, amplified, and upconverted) and transmitted to the remote station. At the remote station, the transmitted RF signal is received and demodulated by a receiver.

A block diagram of an exemplary super-heterodyne receiver of the prior art which is used for quadrature demodulation of QSPK, OQPSK, and QAM signals is illustrated in FIG. 1. Receiver 100 can be used at the base station or the remote station. Within receiver 100, the transmitted RF signal is received by antenna 112, routed through duplexer 114, and provided to front end 102. Within front end 102, amplifier (AMP) 116 amplifies the signal and provides the signal to bandpass filter 118 which filters the signal to remove undesirable images and spurious signals. The filtered RF signal is provided to mixer 120 which downconverts the signal to as intermediate frequency (IF) with the sinusoid from local oscillator (LO1) 122. The IF signal from mixer 120 is filtered by bandpass filter 124 and amplified by automatic gain control (AGC) amplifier 126 to produce the required signal amplitude at the input of analog-to-digital-converters (ADCs) 140. The gain controlled signal is provided to demodulator 104. Within demodulator 104, two mixers 128a and 128b downconvert the signal into the baseband I and Q signals with the sinusoid provided by local oscillator (LO2) 134 and phase shifter 136, respectively. The baseband I and Q signals are provided to lowpass filters 130a and 130b, respectively, which provide match filtering and/or anti-alias filtering of the baseband signals. The filtered signals are provided to ADCs 140a and 140b which sample the signals to produce the digitized baseband samples. The samples are provided to baseband processor 150 for further processing (e.g. error detection, error correction, and decompression) to produce reconstructed estimates of the transmitted data.

The first frequency downconversion with mixer 120 allows receiver 100 to downconvert signals at various RF frequencies to a fixed IF frequency where more signal processing can be performed. The fixed IF frequency allows bandpass filter 124 to be implemented as a fixed bandpass filter, such as a surface acoustic wave (SAW) filter, to remove undesirable images and spurious signals from the IF signal. Removal of images and spurious signals is important since these signals can fold into the signal band (e.g. the band where the input signal is present) at the second frequency downconversion stage. Furthermore, the images and spurious signals can significantly increase the amplitude of the signal into various active components, such as the amplifiers and mixers, which can cause higher level of intermodulation products as the result of non-linearity in the active components. Spurious signals and intermodulation products can cause degradation in the performance of the communication system.

The quadrature demodulator of the prior art has several major drawbacks. First, the required filtering by bandpass filter 124 and/or lowpass filters 130 can be complex. These filters may require a flat passband, high attenuation in the stopband, and sharp roll-off in the transition band. These filters are often implemented with analog circuits. Component tolerance of analog circuits is difficult to maintain and can cause distortion in the frequency response of these filters. The performance of receiver 100 can be degraded as the result of the distortion. Second, quadrature balance is difficult to maintain over many production units because of component tolerance in phase splitter 136, mixers 128, lowpass filters 130, and ADCs 140. Any mismatch in the two signal paths results in quadrature imbalance and degradation in the performance of receiver 100. Path mismatch results in cross-talk of the I signal onto the Q signal, and vice versa. The cross-talk signal behaves as additive noise in the desired signal and results in poor detection of the desired signal. And third, ADCs 140 can cause degradation in the performance of receiver 100 for various reasons described below.

In most demodulators, one or more ADCs are required to convert an analog waveform in continuous time into discrete samples at evenly spaced time intervals. Some important performance parameters of an ADC include dynamic range, linearity, and DC offset. Each of these parameters can affect the performance of the communication system. Dynamic range can affect the bit-error-rate (BER) performance of the receiver because the noise from the ADC degrades the ability of the ADC to properly detect the input signal.

Linearity relates to the difference between an actual transfer curve (e.g., digital output versus analog input) and the ideal transfer curve. Good linearity is more difficult to obtain as the number of bits in the ADC increases. Poor linearity can degrade the error detection/correction process. Finally, DC offset can degrade the performance of the phase locked loop in the receiver and the error correcting decoder, such as the Viterbi decoder.

In the prior art, flash ADCs or successive approximation ADCs are used to sample the baseband signals. Within the flash ADC, the input signal is provided to L−1 comparators, where $L=2^m$ and m is the number of bits in the ADC. Also provided to each comparator is a comparison voltage. The L−1 comparison voltages are generated by a resistive ladder comprising L resistors. Flash ADCs are bulky and consume high power because L−1 comparators and L resistors are required. Flash ADCs can have poor linearity and poor DC offset characteristics if the resistors in the resistive ladder are not matched. However, flash ADCs are popular because of their high operating speed.

Successive approximation ADCs are also popular for communication systems. These ADCs minimize complexity by performing approximations of the input signal over two or more stages. However, these ADCs can also exhibit poor linearity and poor DC offset characteristics similar to those of the flash ADCs. Thus, flash ADCs and successive approximation ADCs are not ideal candidates for use in many communication applications.

Sigma delta analog-to-digital converters (ΣΔ ADCs) have better performance than flash and successive approximation ADCs because of the inherent architecture of the ΣΔ ADC. ΣΔ ADC performs analog-to-digital conversion of the input signal by making successive one-bit approximations of the change in the input signal, since the previous sample has been estimated, at a sampling frequency which is many times higher than the bandwidth of the input signal. The output samples comprise the input signal and the quantization noise. However, the ΣΔ ADC can be designed such that the quantization noise in the signal band is pushed to out-of-band frequency (or noise shaped) where filtering can be performed.

ΣΔ ADC can provide high dynamic range, good linearity, and low DC offset because of the inherent structure of the ΣΔ ADC. For example, high dynamic range can be obtained by selecting a sufficient oversampling ratio (OSR) and the proper noise shaping filter characteristic. The oversampling ratio is defined as the sampling frequency divided by the two-sided bandwidth of the input. Additionally, good linearity and low DC offset can be obtained because of the simple one-bit quantizer within the ΣΔ ADC.

Because a high oversampling ratio is required for high performance, ΣΔ ADCs have been traditionally limited to applications where the input signal is a low bandwidth signal, such as audio application. However, with the advent of high speed analog circuits, ΣΔ ADCs can be implemented to operate at high speed. High speed bandpass and baseband ΣΔ ADC designs and implementations are disclosed in detail in copending U.S. patent application Ser. No. 08/928,847, entitled "SIGMA-DELTA ANALOG-TO-DIGITAL CONVERTER", filed Sep. 12, 1997, assigned to the assignee of the present invention and incorporated by reference herein.

The bandpass ΣΔ ADC provides IF samples which are noise shaped. For bandpass sampling ΣΔ ADC, the IF samples are then filtered and quadrature downconverted to provide I and Q baseband outputs.

SUMMARY OF THE INVENTION

The present invention is a novel and improved noise cancellation circuit and quadrature downconverter. The noise cancellation comprises at least one bandpass decimator and a summer. In the exemplary embodiment, a bandpass Multi-stAge noise SHaping sigma-delta analog-to-digital converter (MASH ΣΔ ADC) is used to sample the analog input signal and each loop in the MASH ΣΔ ADC provides an output signal Y. The output from each loop is provided to a corresponding bandpass decimator. In the exemplary embodiment, each bandpass decimator comprises an error cancellation filter, a bandpass filter, and a decimator. The bandpass filter is used to filter the signal from the error cancellation filter. In the exemplary embodiment, the filtered signal is then decimated by N by the decimator. The signals from all bandpass decimators are summed together and the resultant output comprises the IF samples.

For quadrature downconversion, the IF samples are provided to two multipliers which downconvert the IF samples to I and Q baseband samples with an inphase and a quadrature sinusoid, respectively. The baseband samples are lowpass filtered to further remove quantization noise and undesirable signals.

It is an object of the present invention to provide a noise cancellation circuit and a bandpass filter which minimizes circuit complexity and reduces power consumption. In the exemplary embodiment, the transfer function of the error cancellation circuit is decomposed into a set of transfer functions, one for each output signal Y from the ΣΔ ADC. Each transfer function corresponds to an error cancellation filter. The transfer functions for each of the error cancellation filters and the bandpass filter are convolved to provide the transfer function of a bandpass decimator. The convolved transfer function for each bandpass decimator can be implemented with less hardware than the direct implementation of the corresponding error cancellation filter and bandpass filter. Furthermore, each bandpass decimator operates on one-bit signal Y from a corresponding loop of the MASH ADC. Direct implementation of the error cancellation circuit and the bandpass filter would require the bandpass filter to operate on multiple bits output from the error cancellation circuit. In addition, the decimation by N can be incorporated within the bandpass decimator such that the bandpass decimators only operate at 1/N of the frequency of the ADC sampling clock, thereby reducing power consumption.

It is another object of the present invention to provide a quadrature downconverter with reduced circuit complexity. In the exemplary embodiment, the center frequency of the analog input signal is maintained at $f_{IF}=0.25\cdot(2n+1)\cdot f_{ADC}$, where n is an integer zero or greater, and $f_{ADC}$ is the ADC sampling frequency. This center frequency produces an image of the input signal at $f_c=0.25 f_{ADC}$ after the analog-to-digital conversion. Maintaining the center frequency of the image at $0.25 f_{ADC}$ simplifies the frequency downconversion since the downconversion sinusoids $\cos(w_c t)$ and $\sin(w_c t)$ take on simple values of 1, 0, and −1. In the exemplary embodiment, the decimation by N is selected such that the frequency of the image is maintained at $0.25 f_s$, where $f_s$ is the sample rate of the decimated samples (or $f_s=f_{ADC}/N$). This can be achieved by selecting an odd value for N (e.g., 3, 5, 7, 9, etc.).

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

The present invention is a new and improved noise cancellation circuit and quadrature downconverter which are used in conjunction with an analog-to-digital converter (ADC). In particular, the present invention is well suited for used in combination with a sigma-delta analog-to-digital converter (ΣΔ ADC) which is disclosed in the aforementioned U.S. patent application Ser. No. 08/928,847. Exemplary applications which can utilize the noise cancellation circuit and quadrature downconverter include CDMA communication systems and HDTV systems.

In a bandpass sampling ADC, the input signal to the ADC is centered at an intermediate frequency (IF) instead of baseband. Sampling at IF allows for elimination of a frequency downconversion stage in the receiver, thus simplifying the hardware design and improving reliability. The use of ΣΔ ADC provides many advantages over conventional (e.g. flash and successive approximation) ADCs as described above. The noise shaper within the ΣΔ ADC can be designed such that the quantization noise around the signal band is pushed out-of-band (or noise shaped) where filtering can be performed.

I. Bandpass Sampling Receiver

Figure 1:
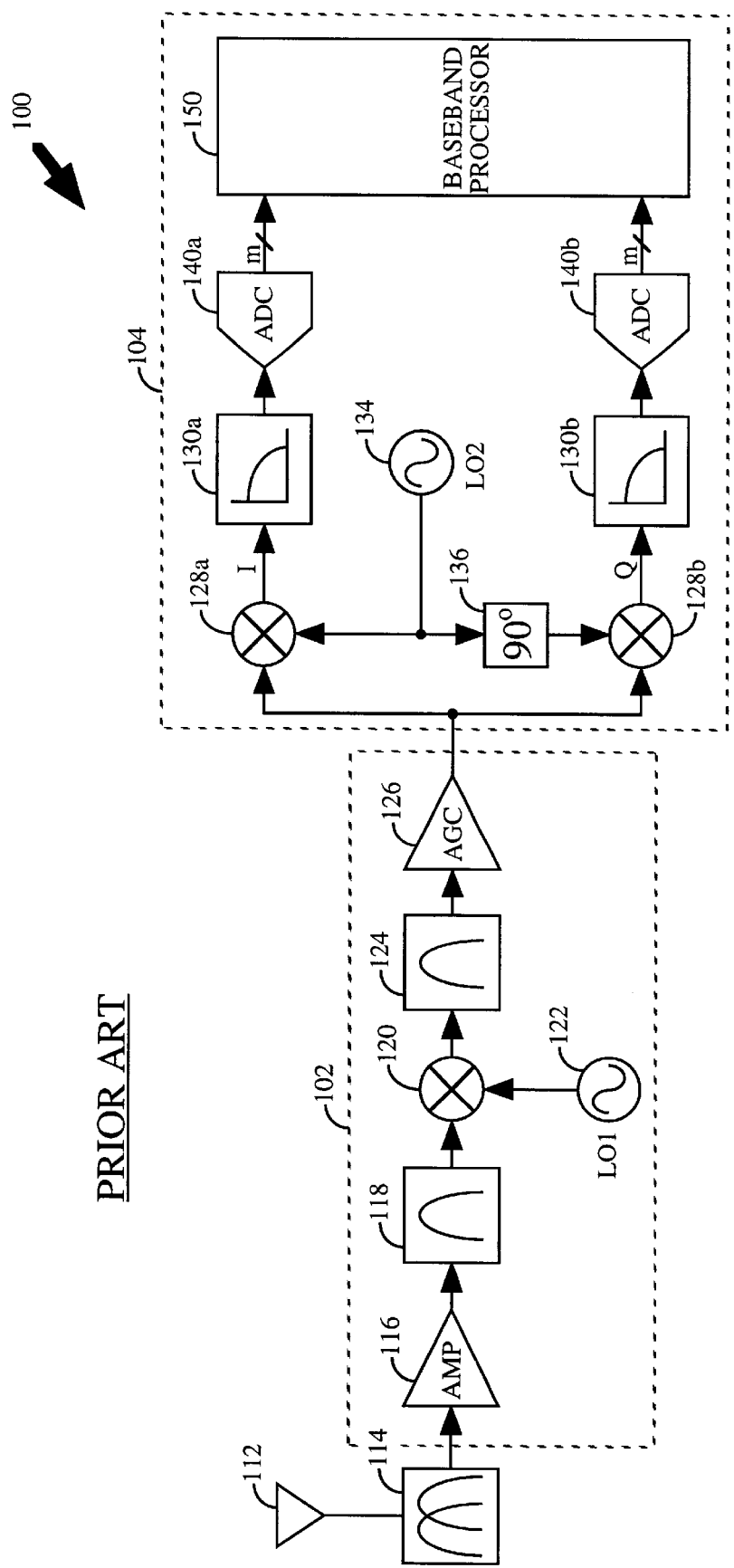
FIG. 1 is a block diagram of an exemplary super-heterodyne receiver of the prior art.
Figure 2:
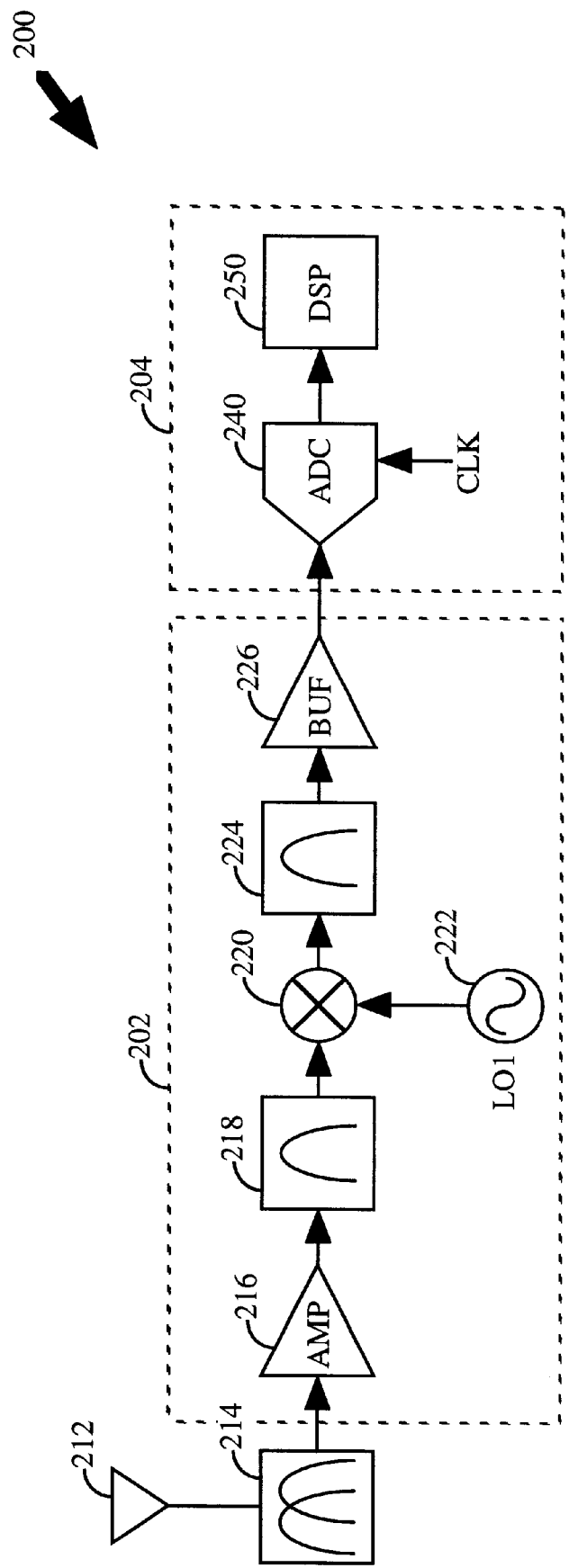
FIG. 2 is a block diagram of an exemplary bandpass sampling receiver of the present invention.

A block diagram of an exemplary bandpass sampling receiver is illustrated in FIG. 2. Receiver 200 can be used to demodulate BPSK, QPSK, OQPSK, QAM, and other digital and analog modulation formats. Within receiver 200, the transmitted RF signal is received by antenna 212, routed through duplexer 214, and provided to front end 202. Within front end 202, amplifier (AMP) 216 amplifies the signal and provides the amplified signal to bandpass filter 218 which filters the signal to remove undesirable images and spurious signals. The filtered signal is provided to mixer 220 which downconverts the signal to an IF frequency with the sinusoid from local oscillator (LO1) 222. The IF signal from mixer 220 is provided to bandpass filter 224 which further filters the signal. In the exemplary embodiment, bandpass filter 224 is a surface acoustic wave (SAW) filter, the implementation of which is known in the art. The filtered signal is provided to buffer (BUF) 226 which provides gain and/or buffering of the signal. The buffered signal is provided to demodulator 204. Within demodulator 204, ADC 240 samples the buffered signal at a high sampling frequency determined by the CLK signal and provides the samples to digital signal processor (DSP) 250. Digital signal processor 250 is described in detail below.

For applications wherein quadrature demodulation is required, such as QPSK, OQPSK and QAM, a bandpass ADC is utilized. The bandpass ADC can be designed and implemented as a bandpass ΣΔ ADC in the manner described in copending U.S. patent application Ser. No. PA447.

Figure 3:
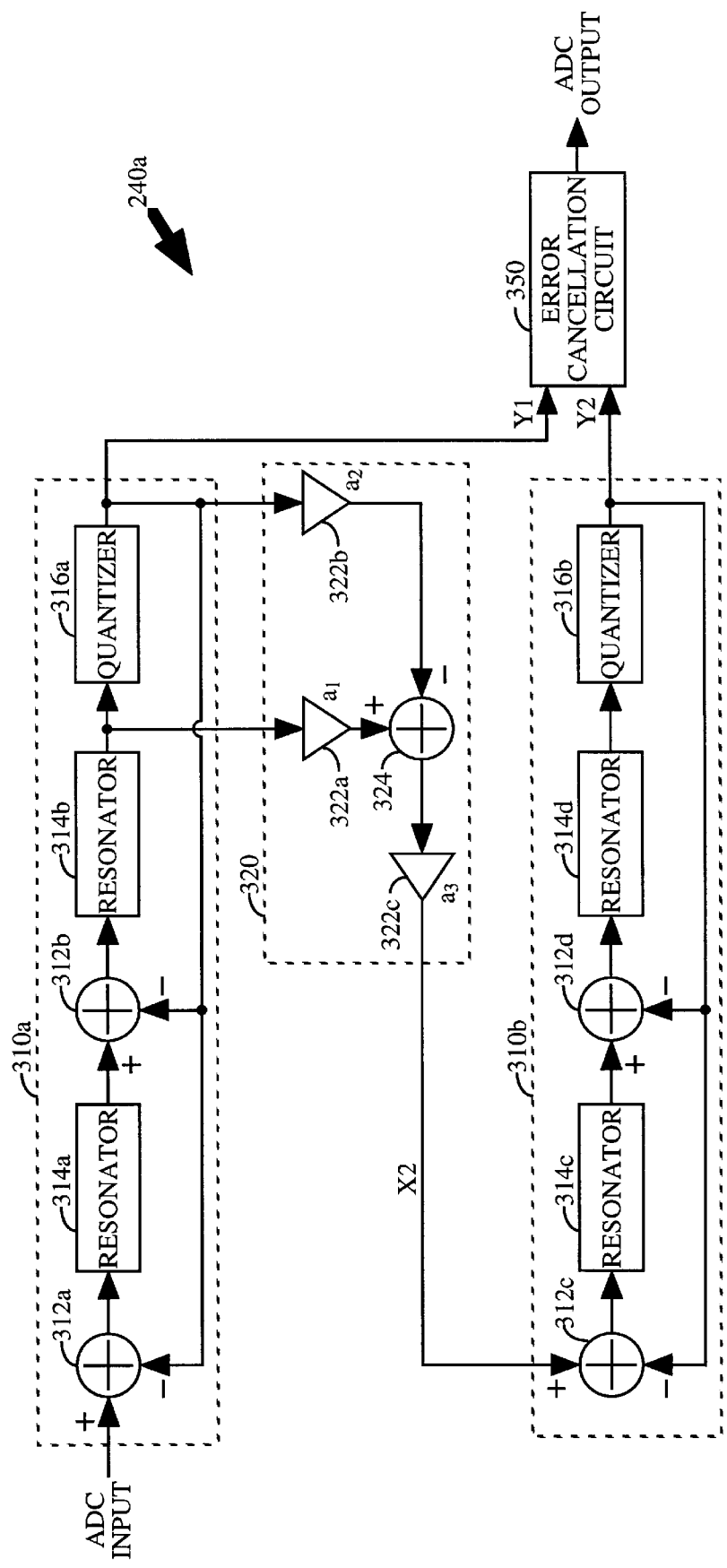
FIG. 3 is a block diagram of an exemplary two loop bandpass MASH ΣΔ ADC.

A block diagram of an exemplary two loop bandpass MASH ΣΔ ADC is illustrated in FIG. 3. ΣΔ ADCs comprising one loop or more than two loops can be designed and utilized and are within the scope of the present invention. MASH ADC 240a comprises two loops 310a and 310b, feed forward element 320, and error cancellation circuit 350. In the exemplary embodiment, MASH ADC 240a receives an analog ADC input and produces a digital ADC output having at least two bits per sample, at least one bit per sample for each loop 310.

The ADC input is provided to loop 310a which produces a 1-bit Y1 signal in response thereto. A fraction of the ADC input and quantization noise (X2) from loop 310a is provided to loop 310b where additional noise shaping is performed. The Y1 and Y2 signals from loops 310a and 310b, respectively, are provided to error cancellation circuit 350. Error cancellation circuit 350 delays, filters, and combines the Y1 and Y2 signals to produce the ADC output.

Within loop 310a, summer 312a receives the ADC input and the Y1 signal from quantizer 316a, subtracts Y1 from the ADC input, and provides the error signal to resonator 314a. Resonator 314a filters the error signal and provides the filtered signal to summer 312b. In the exemplary embodiment, each resonator 314 in MASH ADC 240a is implemented with the bandpass transfer function $$\frac{k_n \cdot z^{-2}}{1+z^{-2}},$$

where $k_n$ is the gain of the n-th resonator 314 within loop 310. Summer 312b also receives Y1 from quantizer 316a, subtracts Y1 from the error signal from resonator 314a, and provides the error signal to resonator 314b which further filters the error signal. The filtered signal from resonator 314b is provided to quantizer 316a which produces the 1-bit Y1 signal in response thereto. Loop 310b is connected in similar manner as loop 310a.

The filtered output from resonator 314b is also provided to gain element 322a which scales the signal by the scaling factor $a_1$. The Y1 signal from quantizer 316a is provided to gain element 322b which scales Y1 by the scaling factor $a_2$. The outputs from gain elements 322a and 322b are provided to summer 324 which subtracts the output from gain element 322b from the output from gain element 322a. The error signal from summer 324 is provided to gain element 322c which scales the error signal by the scaling factor $a_3$. The output from gain element 322c comprises X2 which is provided to loop 310b.

Figure 4:
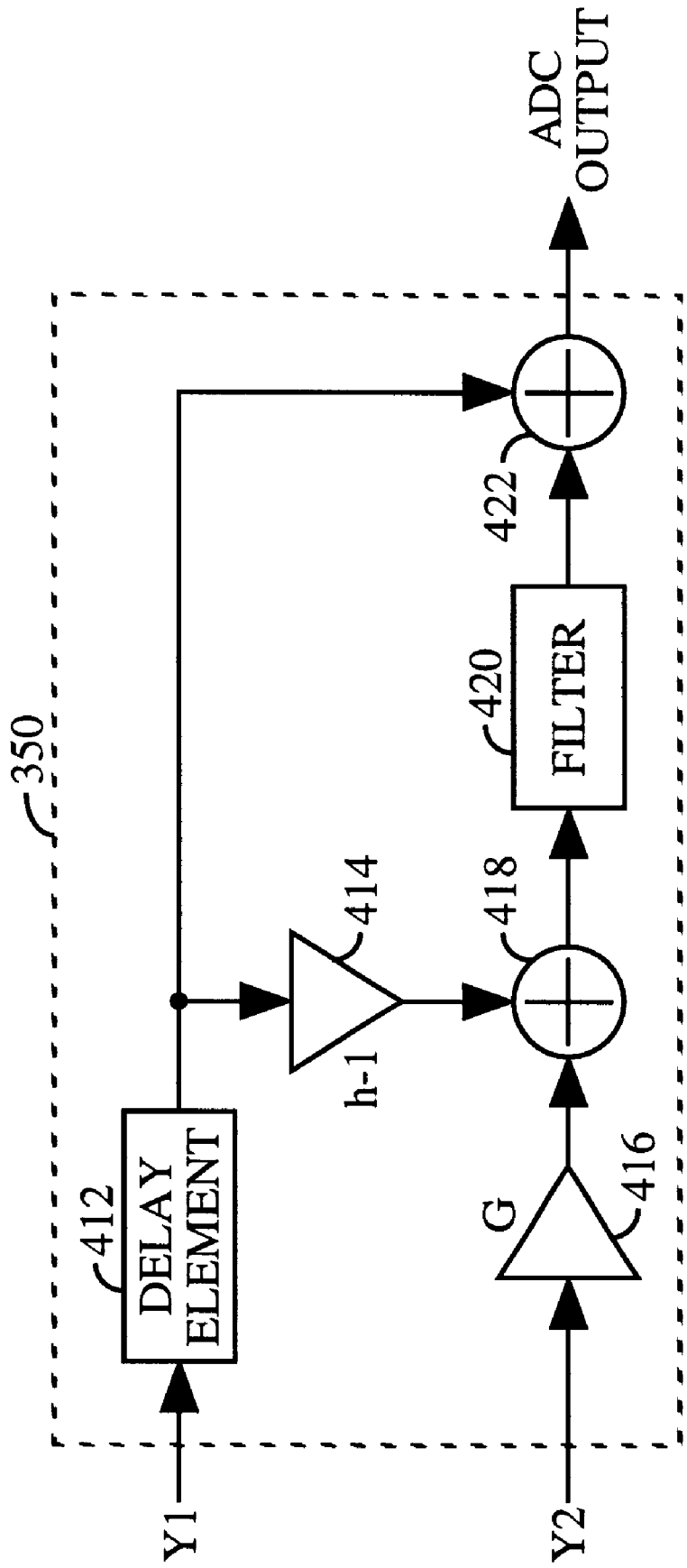
FIG. 4 is a block diagram of an exemplary error cancellation circuit of the present invention.

A block diagram of an exemplary error cancellation circuit 350 is shown in FIG. 4. Within error cancellation circuit 350, the Y1 signal from loop 310a is provided to delay element 412 which delays Y1 by a time interval equal to the processing delay of loop 310b. The delayed Y1 from delay element 412 is time aligned with Y2. The Y2 signal from loop 310b is provided to gain element 416 which scales Y2 by the scaling factor G. The delayed Y1 is provided to gain element 414 which scales the delayed Y1 by the scaling factor (h−1). The scaling factors G and (h−1) partially determine the noise shaping characteristics of ΣΔ ADC 240a. In the exemplary embodiment, the scaling factors are selected to be G=4 and (h−1)=1. The outputs from gain elements 414 and 416 are provided to summer 418 which sums the two scaled outputs. The combined signal from summer 418 is provided to filter 420 which filters the combined signal with the transfer function N(z). The transfer function N(z) of filter 420 and the delay of delay element 412 are selected based on the characteristics of the ΣΔ ADC. In the exemplary embodiment, for a MASH 4—4 bandpass ΣΔ ADC 240a as shown in FIG. 3, filter 420 has the transfer function $N(z)=(1+z^{-2})^2$ and delay element 412 has the transfer function $D(z)=z^{-4}$. Other transfer functions for filter 420 and delay element 412 can also be utilized and are within the scope of the present invention. For a bandpass ΣΔ ADC centered around $f_{ADC}/4$, every second coefficient of N(z) is zero and this characteristic is used to simplify the design of the error cancellation circuit and bandpass filter of the present invention. The output from filter 420 and the delayed Y1 are provided to summer 422 which sums the two signals to produce the ADC output.

From the above exemplary transfer functions for delay element 412 D(z) and filter 420 N(z) and the exemplary scaling factors G=4 and (h−1)=1, the exemplary transfer function Y(z) for error cancellation circuit 350 can be expressed as:

$$Y(z) = EC_{Y1}(z) \cdot Y1(z) + EC_{Y2}(z) \cdot Y2(z) \quad (1)$$
$$= z^{-4}(2 + 2z^{-2} + z^{-4}) \cdot Y1(z) + 4(1 + 2z^{-2} + z^{-4}) \cdot Y2(z)$$
$$= [z^{-4}Y1(z)] + [(1 + 2z^{-2} + z^{-4})(z^{-4}Y1(z) + 4Y2(z))]$$

In equation (1), the term in the first bracket comprises the signal component and the term in the second bracket comprises the total quantization noise after error cancellation. Note that the transfer function Y(z) of error cancellation circuit 350 can be viewed as running the Y1 signal through a first finite impulse response (FIR) filter having the coefficients $EC_{Y1}(z)$, running the Y2 signal through a second FIR filter having the coefficients $EC_{Y2}(z)$, and summing the two FIR filter outputs. The coefficients for the FIR filters can be expressed as:

$$EC_{Y1}(z)=[0\ 0\ 0\ 0\ 2\ 0\ 2\ 0\ 1] \quad (2)$$
$$EC_{Y2}(z)=[1\ 0\ 2\ 0\ 1] \cdot 4$$

From equation (2), it can be noted that although the inputs into error cancellation circuit 350 comprise two signals, Y1 and Y2, each having one bit of resolution, the output from error cancellation circuit 350 comprises five bits of resolution and has a range of 0 to 21. From equation (1), it can be noted that the amplitude of the signal is not amplified. However, the quantization noise is processed and shaped, and additional range is required for the shaped out-of-band quantization noise.

Figure 5:
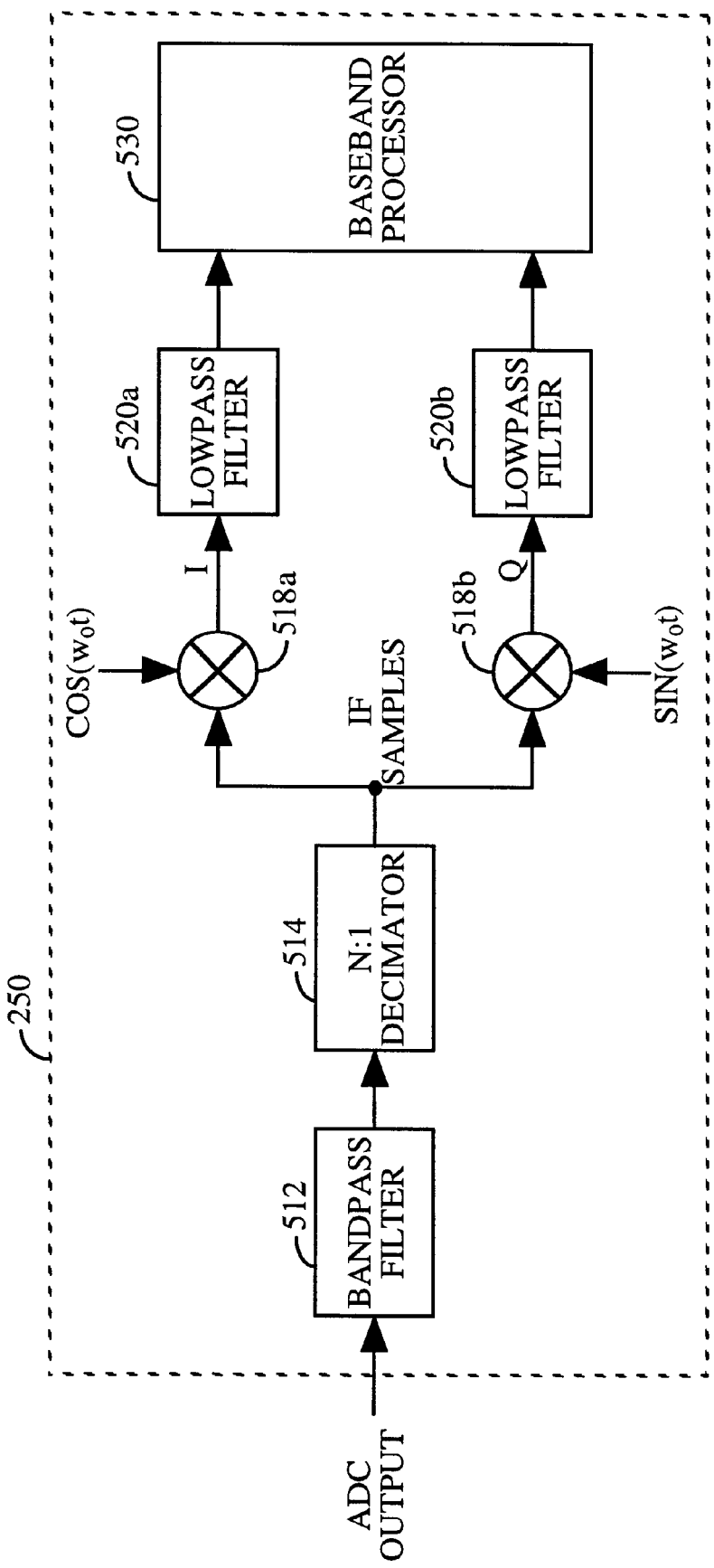
FIG. 5 is a block diagram of an exemplary digital signal processor used for quadrature demodulation.

An exemplary block diagram of digital signal processor 250 used for quadrature demodulation is illustrated in FIG. 5. The ADC output from ADC 240 is provided to bandpass filter 512 which filters the signal to remove quantization noise and other spurious signals. In the exemplary embodiment, bandpass filter 512 has the following transfer function:

$$H_{BPF}(z)=(1-z^{-2}+z^{-4})^p, \quad (3)$$

where p is the order of the order of bandpass filter 512. The transfer function in equation (3) provides zeros at $f_{ADC}/12$ and $5f_{ADC}/12$ and has a maximum gain at $f_{ADC}/4$. In the exemplary embodiment, the characteristic of bandpass filter 512 is selected in conjunction with decimator 514, as described below. Other bandpass filter transfer functions can also be utilized and are within the scope of the present invention.

The use of bandpass filter 512 after error cancellation circuit 350 provides many advantages. In the exemplary embodiment, the received signal is centered at $f_{ADC}/4$ after conversion by ADC 240a. Thus, the amplitude response of bandpass filter 512 is designed to provide a passband around $f_{ADC}/4$ and the transfer function of bandpass filter 512 comprises zero for every other coefficient. This filter coefficient characteristics can be combined with a similar characteristic of error cancellation circuit 350, as shown in equation (2), to simplify the overall design of error cancellation circuit 350 and bandpass filter 512. Furthermore, as stated above, the output from error cancellation circuit 350 can comprise five bits of resolution. Designing bandpass filter 512 to compute the required 5-bit precision arithmetic can greatly increase the complexity of bandpass filter 512. In the exemplary embodiment, error cancellation circuit 350 and bandpass filter 512 are combined such that the resultant circuit operates on the 1-bit Y1 and Y2 signals directly. Finally, bandpass filter 512 removes a large portion of the quantization noise from ADC 240a such that the required dynamic range after bandpass filter 512 is reduced accordingly.

The filtered signal from bandpass filter 512 is provided to decimator 514 which decimates the signal by a factor of N to 1, where N is an odd number in the exemplary embodiment. For every N input samples, decimator 514 retains 1 sample and discards the remaining N−1 samples. The output from decimator 514 comprises the IF samples which are provided to multipliers 518a and 518b. Multipliers 518a and 518b downconvert the IF samples to I and Q baseband samples with the inphase $\cos(w_c t)$ and quadrature $\sin(w_c t)$ sinusoids, respectively. The I and Q baseband samples are provided to lowpass filters 520a and 520b, respectively, which filter the samples to provide the I and Q outputs. The I and Q outputs are provided to baseband processor 530 which performs additional signal processing, such as filtering, decimation, error detection/correction, and decompression. In the exemplary embodiment, bandpass filter 512 and/or lowpass filters 520 can also provide scaling of the signal to enable digital signal processor 530 to provide baseband data at various amplitude. Other implementations of digital signal processor 250 can be designed to performed quadrature demodulation and are within the scope of the present invention.

Figure 6:
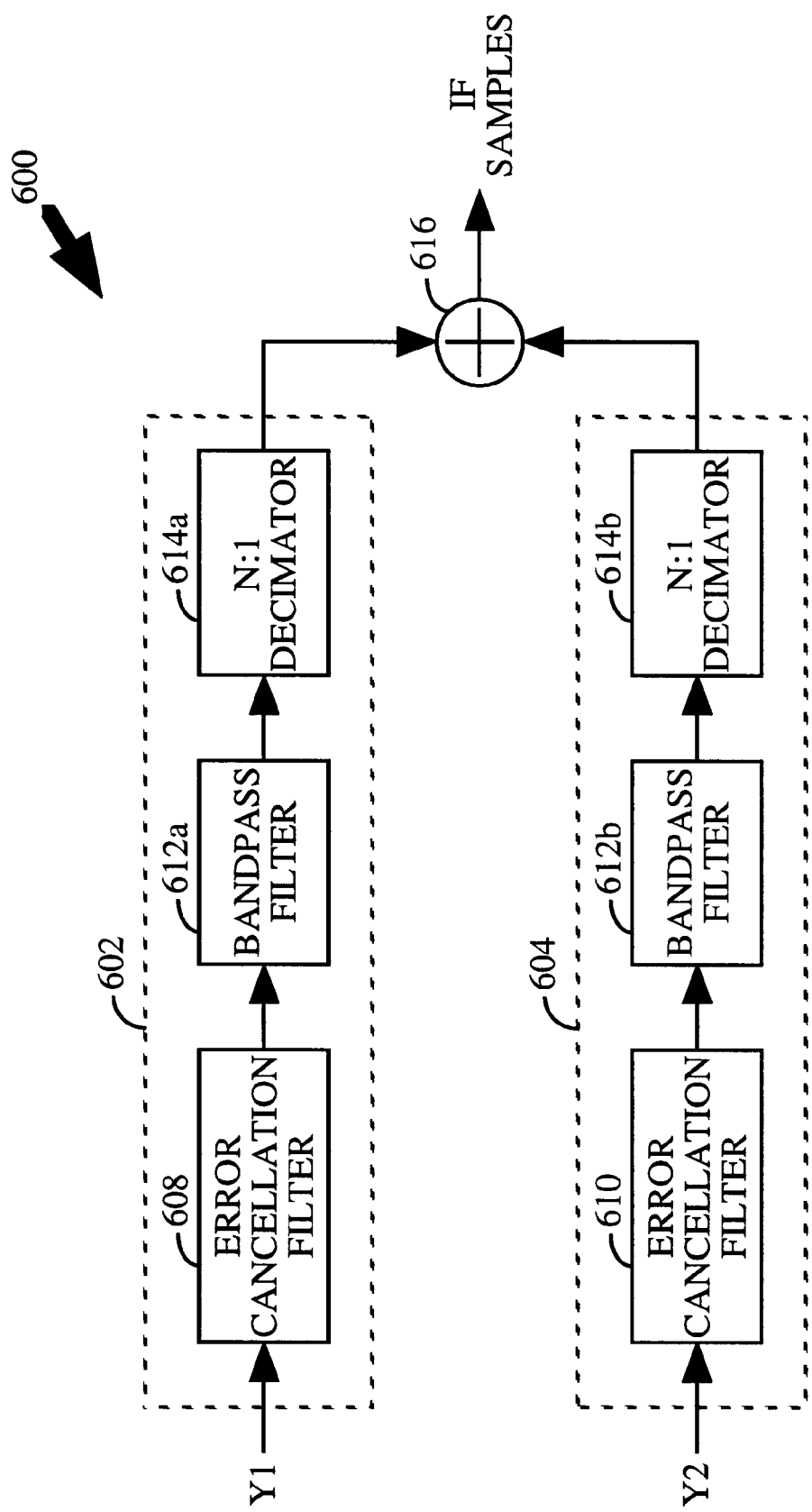
FIG. 6 is a block diagram showing an exemplary noise cancellation circuit.

Error cancellation circuit 350 and bandpass filter 512 can be implemented with direct implementation, as shown in FIGS. 5 and 6. However, direct implementation would yield a complicated design since two circuits are required for error cancellation circuit 350 and bandpass filter 512 and bandpass filter 512 would be designed to operate on a signal having five bits of resolution. In the present invention, error cancellation circuit 350 and bandpass filter 512 are combined.

An exemplary block diagram of the digital signal processing of the Y1 and Y2 signals using noise cancellation circuit 600 is illustrated in FIG. 6. The Y1 and Y2 signals are provided to bandpass decimators 602 and 604, respectively. In the exemplary embodiment, one bandpass decimator is provided for each loop of MASH ADC 240a. Within bandpass decimator 602, the Y1 signal is provided to error cancellation filter 608 which filters Y1 with the transfer function $EC_{Y1}(z)$ as shown in equation (2). The filtered Y1 is provided to bandpass filter 612a. In the exemplary embodiment, bandpass filters 612 each has the same transfer function as bandpass filter 512, as shown in equation (3). The filtered signal from bandpass filter 612a is provided to decimator 614 which operates in the same manner as decimator 514. Bandpass decimator 604 is identical to bandpass decimator 602 except that error cancellation filter 610 implements the transfer function $EC_{Y2}(z)$ as shown in equation (2).

In the exemplary embodiment, the transfer functions of error cancellation filter 608 and bandpass filter 612a are convolved to generate the transfer function of bandpass decimator 602. Similarly, the transfer functions of error cancellation filter 610 and bandpass filter 612b are convolved to generate the transfer function of bandpass decimator 604. The improvement achieved by implementing bandpass decimators 602 and 604 with the convolved transfer functions can be illustrated for an exemplary third order bandpass filter 612. The transfer function $H_{BPF3}(z)$ of the third order bandpass filter 612 can be computed from equation (3) with p=3 and represented as a FIR filter having the following coefficients:

$$H_{BPF3}(z)=[1\ 0\ -3\ 0\ 6\ 0\ -7\ 0\ 6\ 0\ -3\ 0\ 1]. \quad (4)$$

For bandpass decimator 602, convolving the coefficients of error cancellation filter 608 with the coefficients of bandpass filter 612a yields the resultant transfer function $H_{Y1}(z)$, which is shown in equation (5). Similarly, for bandpass decimator 604, convolving the coefficients of error cancellation filter 610 with the coefficients of bandpass filter 612b yields the resultant transfer function $H_{Y2}(z)$. $H_{Y1}(z)$ and $H_{Y2}(z)$ can be expressed as FIR filters having the coefficients shown in equation (5).

$$H_{Y1}=[0\ 0\ 0\ 0\ 2\ 0\ -4\ 0\ 7\ 0\ -5\ 0\ 4\ 0\ -1\ 0\ 2\ 0\ -1\ 0\ 1]$$

$$H_{Y2}=[1\ 0\ -1\ 0\ 1\ 0\ 2\ 0\ -2\ 0\ 2\ 0\ 1\ 0\ -1\ 0\ 1]\cdot 4 \quad (5)$$

The convolution of the coefficients for error cancellation filters 608 and 610 with the coefficients for bandpass filter 612 to obtain the convolved filter coefficients $H_{Y1}(z)$ and $H_{Y2}(z)$, respectively, provides many improvements. First, the required number of adders is reduced by the convolution of the two transfer functions. From equation (4), notice that the implementation of the bandpass filter transfer function $H_{BPF3}(z)$ requires 12 adders (e.g., one adder for each coefficient of 1 and two adders for each coefficient of -3, 6 or 7). In contrast, from equation (5), notice that the implementation of the convolved filter $H_{Y1}(z)$ requires 11 adders (e.g., one adder for each coefficient of 1, -1, 2, 4 or -4 and two adders for each coefficient of -5 or 7). Similarly, notice that the implementation of the convolved filter $H_{Y2}(z)$ requires 9 adders (e.g., one adder for each coefficient of 1, -1, 2 or -2).

The number of adders required for the convolved filters (error cancellation filter and bandpass filter) is less than that required for the bandpass filter alone. Second, the convolved filters $H_{Y1}(z)$ and $H_{Y2}(z)$ operate on the Y1 and Y2 signals, respectively, each having only one bit of resolution. In contrast, direct implementation (e.g., without convolving) of error cancellation filters 608 and 610 and bandpass filters 612 would result in bandpass filters 612 having to operated on 5-bit outputs from error cancellation filters 608 and 610. Third, decimators 614 can be incorporated within convolved filters $H_{Y1}(z)$ and $H_{Y2}(z)$ such that an output sample is computed once every N input samples. Operating the convolved filters at 1/N of the frequency of the ADC sampling clock minimizes power consumption.

In the exemplary embodiment, for a subsampling bandpass receiver, ADC 240 is a bandpass $\Sigma\Delta$ ADC 240a which shapes the quantization noise in the manner disclosed in copending U.S. patent application Ser. No. PA447. For a bandpass $\Sigma\Delta$ ADC, the quantization noise around $0.25 \cdot f_{ADC}$ is pushed toward DC and $0.50 \cdot f_{ADC}$ where filtering of the quantization noise can be performed. In the exemplary embodiment, the center frequency of the IF signal is selected such that an image appears at $f_c=0.25 \cdot f_{ADC}$ after the analog-to-digital conversion, the frequency where the quantization noise is minimized.

Figure 7B:
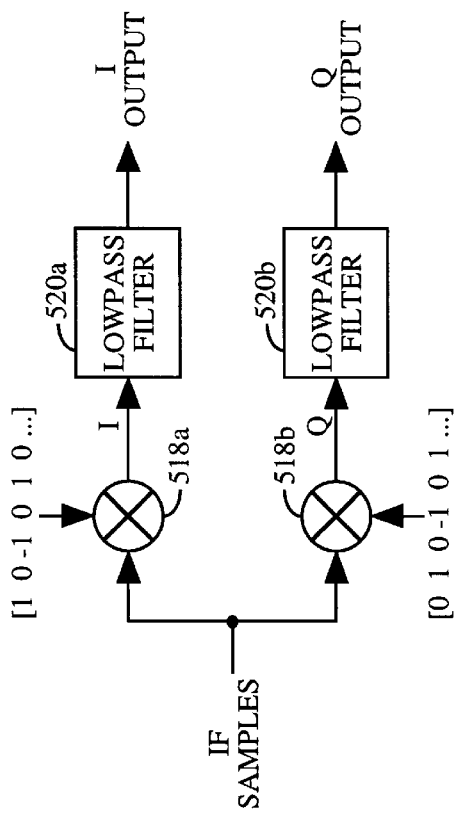
FIGS. 7A and 7B are block diagrams of an exemplary quadrature downconverter for IF samples centered at any frequency and IF samples centered at $0.25f_s$, respectively.
Figure 7A:
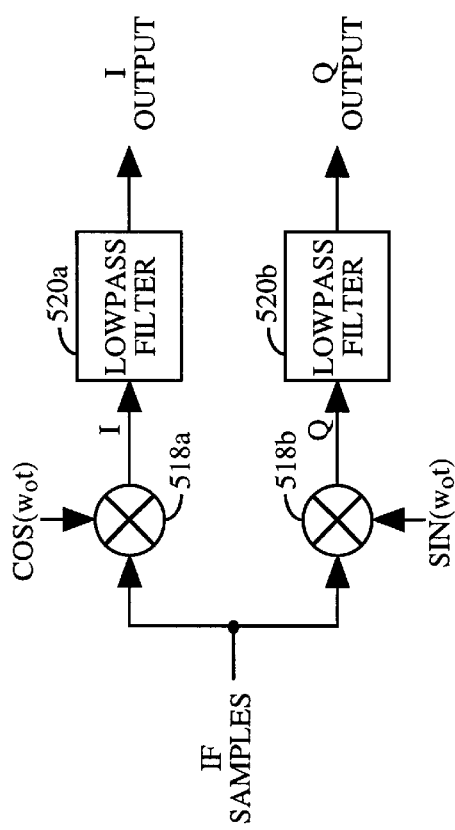

The quadrature downconverter as shown in FIG. 5 is redrawn in FIG. 7A. The IF samples from decimator 514 are downconverted to baseband samples by multipliers 518a and 518b with the inphase $\cos(w_c t)$ and quadrature $\sin(w_c t)$ sinusoids, respectively. By proper selection of the ADC sampling frequency in relation to the center frequency of the IF signal, the frequency downconversion stage can be made trivial. In particular, if the ADC sampling frequency is selected to be approximately four times the center frequency of the downconverted image (e.g., $f_c=0.25 \cdot f_{ADC}$), the quadrature downconversion by multipliers 518a and 518b can be performed by multiplying the IF samples with the inphase sequence [1, 0, -1, 0, 1, 0, . . . ] and quadrature sequence [0, 1, 0, -1, 0, 1, . . . ], respectively, as shown in FIG. 7B. This is because when $f_c=0.25 \cdot f_{ADC}$ the sine and cosine functions are computed at $(i\pi/2)$ and take on values of 1, 0, or -1 for integer values of i. In the exemplary embodiment, an external frequency control loop can be utilized to maintain the center frequency of the image at approximately one quarter of the ADC sampling frequency.

Referring to FIG. 7B, it can be noted that every other value of the inphase sequence [1, 0, -1, 0, 1, 0, . . . ] is zero. Similarly, it can also be noted that every other value of the quadrature sequence [0, 1, 0, -1, 0, 1, . . . ] is zero. Furthermore, the inphase and quadrature sequences are valid (e.g., not zero) on alternative values. These characteristics can be used to simplify the design of the quadrature downconverter.

Figure 7C:
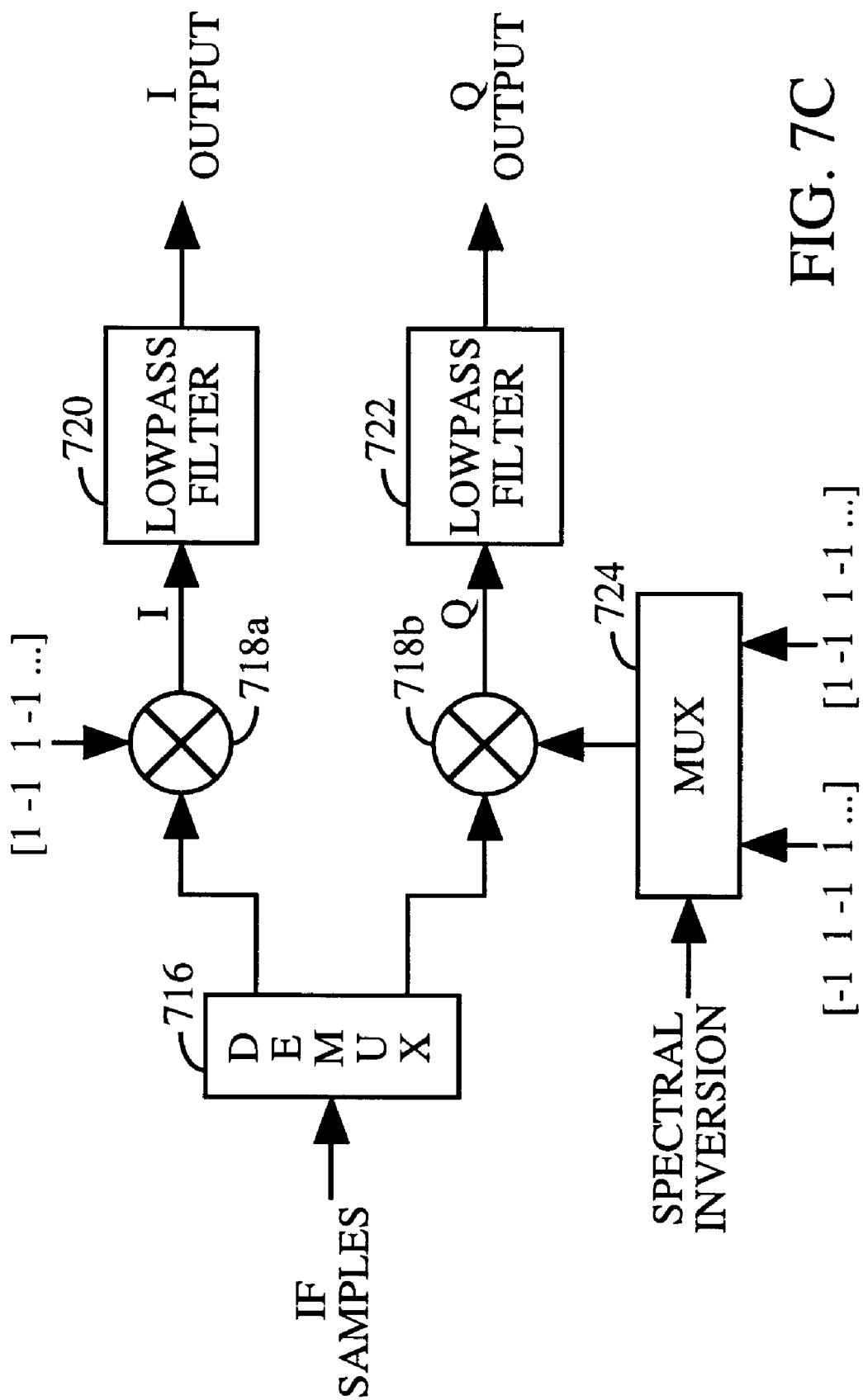
FIG. 7C is a block diagram of an exemplary implementation of a quadrature downconverter for IF samples centered at $0.25f_s$.

A block diagram of an exemplary quadrature downconverter which takes advantage of the above characteristics is shown in FIG. 7C. In the exemplary embodiment, the quadrature downconverter is designed such that every other IF sample is provided by demultiplexer (DEMUX) 716 to multiplier 718a and every other alternative IF sample is provided to multiplier 718b. Using this architecture, multipliers 718a and 718b can be operated at half the speed as multipliers 518a and 518b, thereby reducing power consumption. Lowpass filters 720 and 722 are equivalent to lowpass filters 520a and 520b, respectively. However, because of demultiplexing by DEMUX 716, the samples provided to multipliers 718a and 718b are 90 degree out of phase or time skewed by one sample. In the exemplary embodiment, to time aligned the I output and Q output from lowpass filters 720 and 722, respectively, lowpass filter 720 is designed with an additional delay of one half sample cycle with respect to the delay of lowpass filter 722. In the exemplary embodiment, the amplitude response of lowpass filters 720 and 722 are designed to be approximately similar to minimize IQ imbalance and IQ crosstalk. The additional delay can be provided by using different filter transfer functions for filters 720 and 722. Alternatively, the additional delay can be provided by using the same filter transfer function for filters 720 and 722, which are clocked at least twice the sample rate, and delaying the output of filter 720 by one half sample. Various other methods to provide substantially similar amplitude response but different delays for lowpass filters 720 and 722 can be contemplated and are within the scope of the present invention.

Spectral inversion of the spectrum of the sampled signal can occur when the signal is subsampled. The occurrence of spectral inversion is dependent on the sampling frequency of the ADC relative to the center frequency of the signal being sampled. In the exemplary embodiment, the CDMA signal is centered at $f_{IF}=0.25 \cdot (2n+1) \cdot f_{ADC}$, where n is an integer equal to or greater than zero, and $f_{ADC}$ is the ADC sampling frequency. For odd n, spectral inversion occurs and for even n, no spectral inversion occurs. Also, decimation by 3 by decimators 614 also causes spectral inversion. The spectral inversion can be corrected by selecting a quadrature sinusoid which is 180° out of phase, or an inverted quadrature sinusoid. The quadrature sinusoid or the inverted quadrature sinusoid can selected through multiplexer (MUX) 724 by the spectral inversion signal, as shown in FIG. 7C.

II. Exemplary Bandpass Receiver Design

Figure 8:
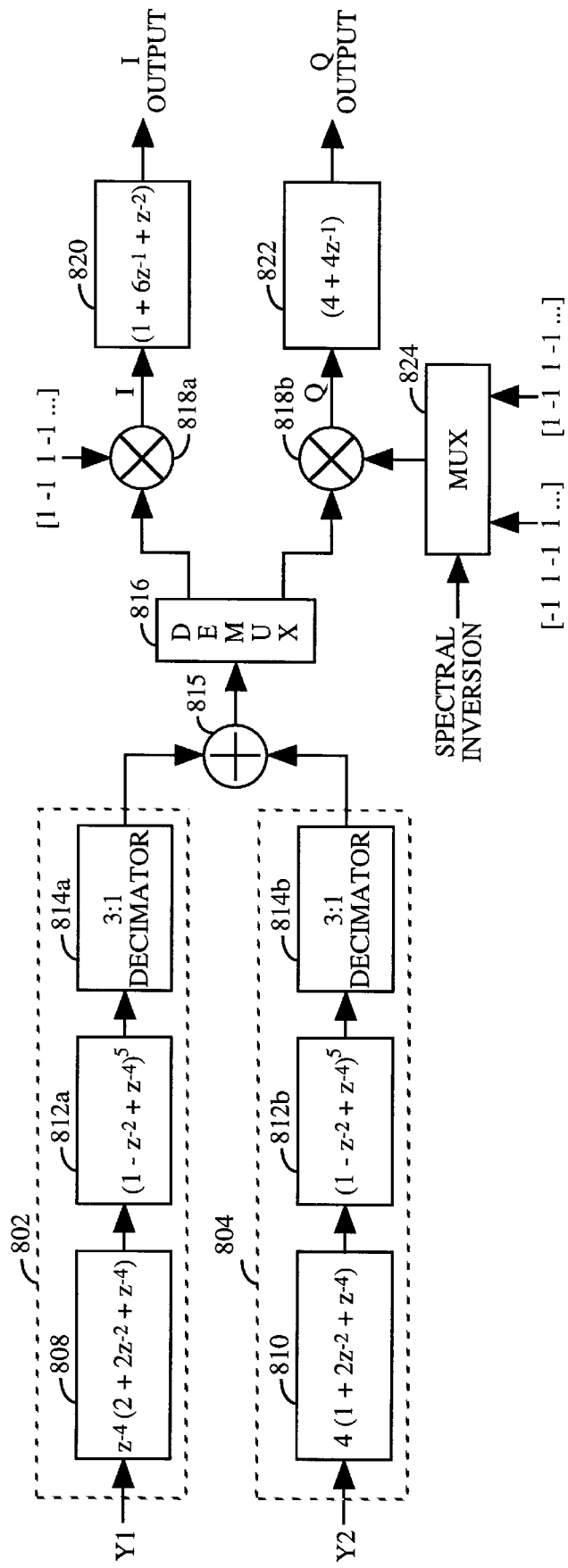
FIG. 8 is a block diagram showing an exemplary noise cancellation circuits and quadrature downconverter.
Figure 10A:
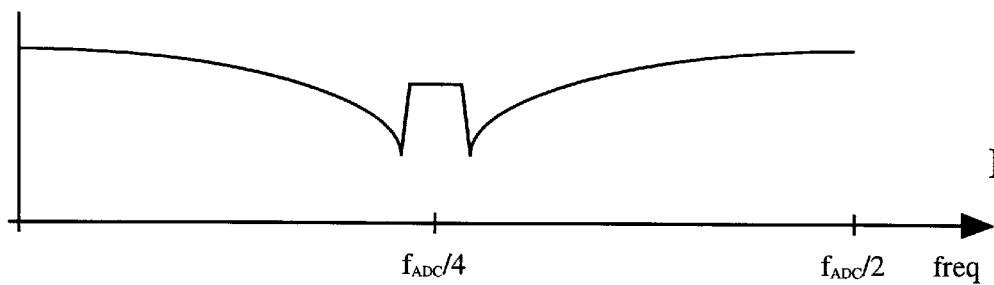
FIGS. 10A–10E are exemplary spectrum of the Y1 signal from the MASH ΣΔ ADC, the spectrum of the Y1 signal after the error cancellation filter, the frequency response of the bandpass filter after the error cancellation filter, the spectrum of the Y1 signal after the bandpass filter, and the spectrum of the Y1 signal after the 3:1 decimation, respectively.

An exemplary noise cancellation circuit and quadrature downconverter design for a CDMA application is shown in FIG. 8. The signal processing illustrated in FIG. 8 is a combination of the noise cancellation circuits shown in FIGS. 6 and the quadrature downconverter shown in FIG. 7C. In the exemplary embodiment, the CDMA signal has a bandwidth of 1.228 MHz and is centered at $f_{IF}=0.25 \cdot (2n+1) \cdot f_{ADC}$. This center frequency and ADC sampling frequency relationship produces an image of the CDMA signal at $0.25 \cdot f_{ADC}$ after conversion by the ADC. In the exemplary embodiment, the ADC is implemented as a MASH 4—4 $\Sigma\Delta$ ADC as described in the aforementioned U.S. patent application Ser. No. PA447. In the exemplary embodiment, the $\Sigma\Delta$ ADC can operate in one of several modes. In the high dynamic range mode, the $\Sigma\Delta$ ADC provides the Y1 and Y2 signals, as shown in FIG. 3. In the medium or low dynamic range mode, the $\Sigma\Delta$ ADC can provide either the Y1 or Y2 signal. An exemplary spectrum of the Y1 signal is shown in FIG. 10A.

Figure 10B:
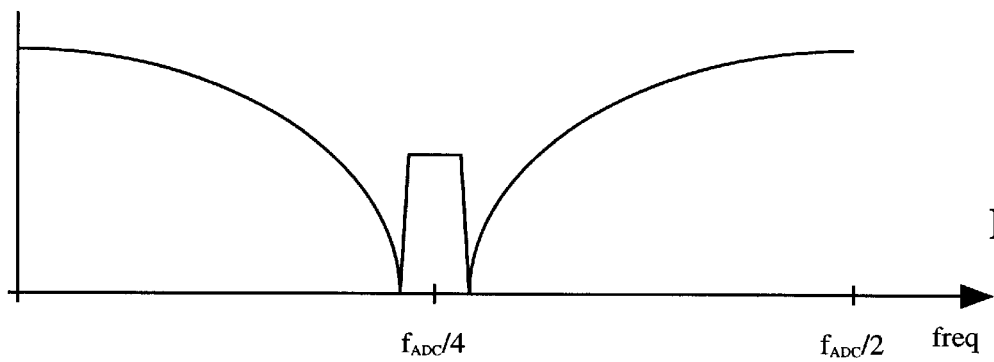
Figure 10C:
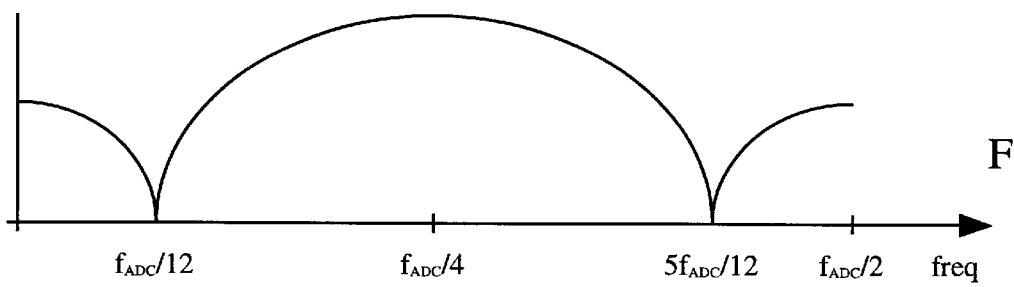
Figure 10D:
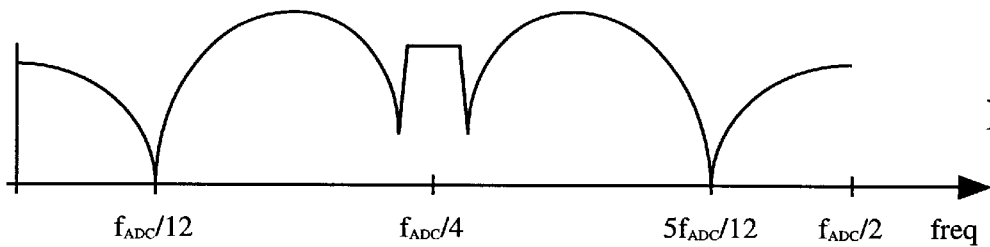

In the exemplary embodiment, bandpass decimator 802 comprises error cancellation filter 808, bandpass filter 812a, and decimator 814a and bandpass decimator 804 comprises error cancellation filter 810, bandpass filter 812b, and decimator 814b. In the exemplary embodiment, error cancellation filters 808 and 810 are designed with the transfer functions $EC_{Y1}(z)$ and $EC_{Y2}(z)$ as shown in equation (1), respectively. An exemplary spectrum of the Y1 signal after error cancellation filter 808 is shown in FIG. 10B. In the exemplary embodiment, bandpass filters 812a and 812b are connected to error cancellation filters 808 and 810, respectively, and are each designed as a fifth order bandpass filter having the transfer function shown in FIG. 8. The fifth order bandpass filters 812 are different from the exemplary third order bandpass filter shown in equations (4) and (5) above. The higher order filters are utilized to more fully capture the performance of the $\Sigma\Delta$ ADC. The error cancellation circuit produces a deep notch around the desired signal band (thereby lowering the noise floor of the desired signal band) and pushes the quantization noise out-of-band. To more fully capture the dynamic range of the $\Sigma\Delta$ ADC, the fifth order bandpass filter is used to filter the out-of-band quantization noise such that the noise that is folded into the desired signal band by the subsequent decimation stage is comparable in magnitude to noise floor of the $\Sigma\Delta$ ADC. An exemplary frequency response of bandpass filter 812 is shown in FIG. 10C and an exemplary spectrum of the Y1 signal after bandpass filter 812a is shown in FIG. 10D. Different bandpass filter transfer functions and different filter order can be utilized and are within the scope of the present invention.

Figure 10E:
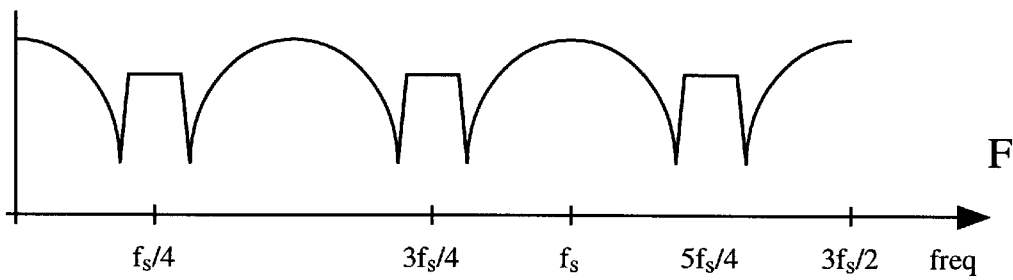

In the exemplary embodiment, decimators 814 are each implemented as a 3 to 1 decimator. Decimation by an odd integer (e.g., 3, 5, 7, 9, etc.) maintains the CDMA signal at one quarter of the sample rate after the decimation such that the subsequent quadrature downconversion step can be easily performed. Initially, the CDMA signal is centered around $f_{ADC}/4$ after the ADC conversion, as shown in FIGS. 10A and 10B. After decimation by three, the CDMA signal is folded such that the signal centered at $f_{ADC}/4$ is translated to $f_{ADC}/12$ or $f_s/4$, where $f_s$ is the sample rate of the decimated samples. For improved performance, the noise at $f_{ADC}/12$ is filtered by placing a notch at that frequency location in bandpass filter 812, as shown in FIG. 10C. Furthermore, it can be noted that the signal at $5f_{ADC}/12$ also folds down to $f_{ADC}/12$ after the decimation by three. Thus, bandpass filter 812 is designed with a second notch at $5f_{ADC}/12$ to filter out undesirable signals at this frequency location which will fold down to $f_{ADC}/12$. The exemplary spectrum of the Y1 signal after decimation by three is shown in FIG. 10E.

As stated above, the transfer function of bandpass filters 812 is selected based on the selection of decimators 814. In the exemplary embodiment, the transfer function of bandpass filter 812 is designed with a zero at $f_s/4$ and at each frequency location which folds down to $f_s/4$ after decimation by N. Stated differently, for a decimation by N, bandpass filter 812 is designed such that a zero is placed at $mf_{ADC}/4N$, where m is an positive odd integer less than 2N and m≠N. For the decimation by three design described above, zeros are placed at $f_{ADC}/12$ and $5f_{ADC}/12$. Similarly, for a decimation by five design, zeros are placed at $f_{ADC}/20$, $3f_{ADC}/20$, $3f_{ADC}/20$, and $9f_{ADC}/20$.

In the exemplary embodiment, the coefficients for the bandpass filter which comprise the zeros at the desired frequency locations can be synthesized as follows. First, start with the same number of ones as the decimation N, e.g., [1 1 1] for decimation by three. Second, invert every other filter coefficient, e.g., [1 −1 1]. And third, insert a zero between each pair of coefficients, e.g., [1 0 −1 0 1]. The filter coefficients after the third step comprise the filter transfer function which provides the zeros at the desired frequency locations. For a decimation by five, the filter coefficients are [1 0 −1 0 1 0 −1 0 1]. Similarly, for a decimation by seven, the filter coefficients are [1 0 −1 0 1 0 −1 0 1 0 −1 0 1]. It should be noted that this synthesis method is only applicable for odd N. However, decimation by odd N is preferred since the image of the decimated signal is maintained at $f_s/4$ to simplify the design of the quadrature downconverter.

Referring to FIG. 8, the outputs from decimators 814a and 814b are provided to summer 815 and combined. The IF samples from summer 815 are provided to demultiplexer (DEMUX) 816 which directs alternative samples to multipliers 816*a* and 816*b*. DEMUX 816, multipliers 818, and multiplexer (MUX) 824 perform the functions as described for DEMUX 716, multipliers 718, and MUX 724 as shown in FIG. 7C. The outputs from multipliers 818*a* and 818*b* are provided to lowpass filters 820 and 822, respectively. In the exemplary embodiment, lowpass filters 820 and 822 have the transfer functions as shown in FIG. 8. The transfer function of lowpass filter 820 has substantially similar amplitude response to the transfer function of lowpass filter 822. However, the transfer function of lowpass filter 820 provides an additional delay of one sample with respect to the delay of lowpass filter 822 such that the I output is time aligned with the Q output.

III. Exemplary Polyphase Implementation

Figure 9A:
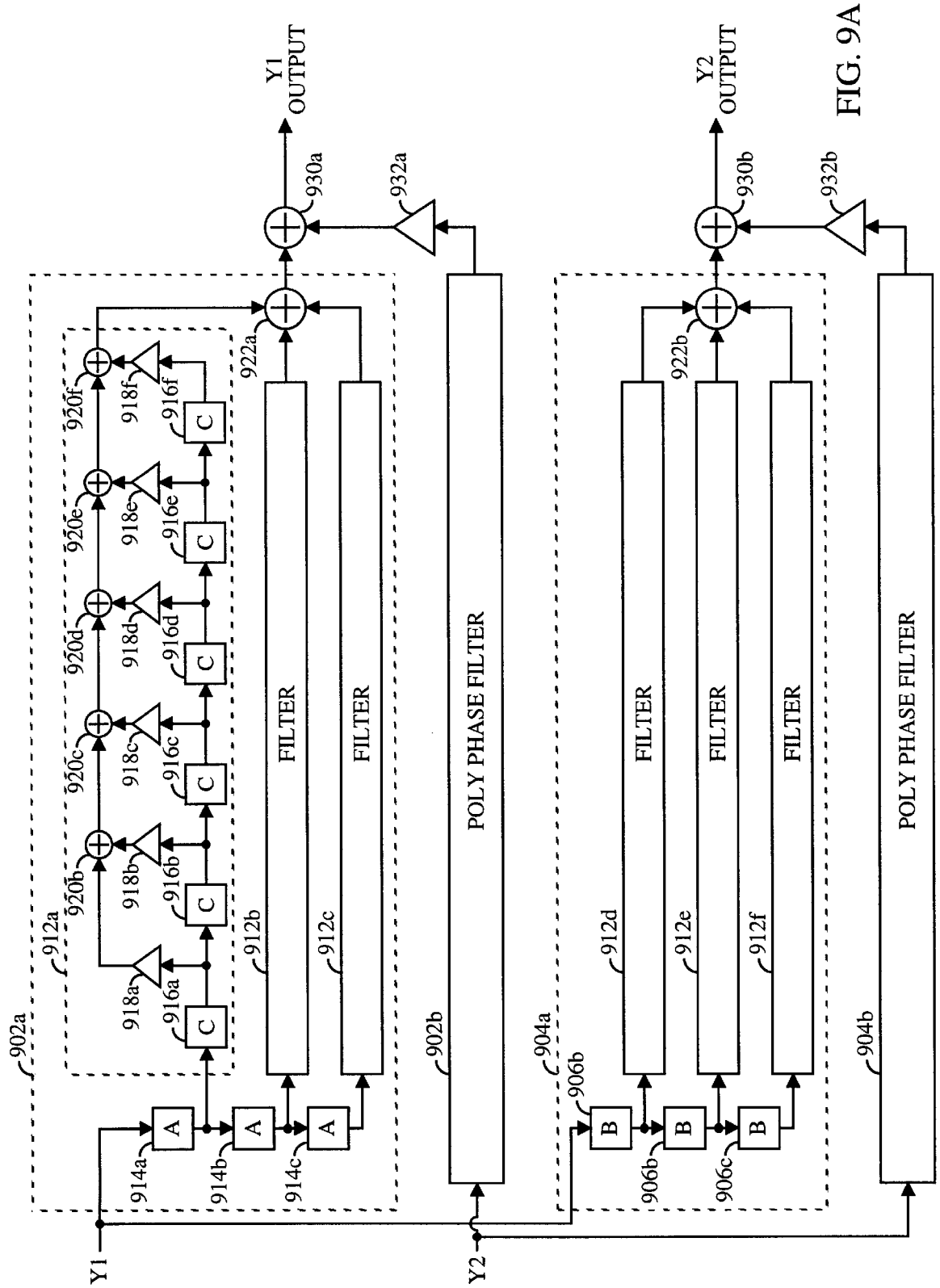
FIGS. 9A–9B are block diagrams of an exemplary implementation of the noise cancellation circuits and quadrature downconverter, respectively, of FIG. 8 using a polyphase structure.
Figure 9B:
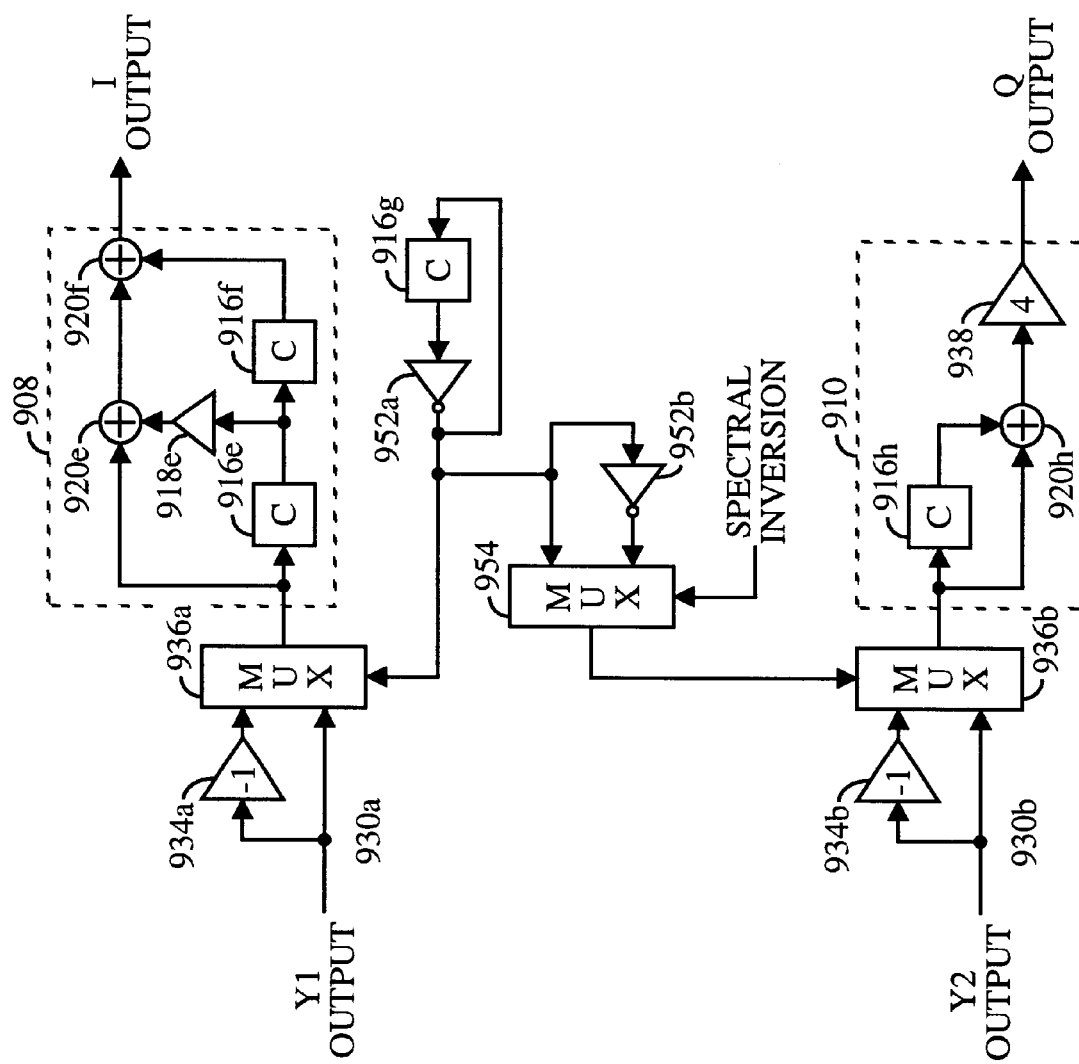

The noise cancellation circuit and quadrature downconverter shown in FIG. 8 can be implemented in many manner. An exemplary implementation of the noise cancellation circuit and quadrature downconverter using a polyphase structure is shown in FIGS. 9A–B, respectively. The polyphase structure is a functional and bit-exact equivalent to the direct implementation and takes advantage of the characteristic that every other coefficient in the transfer functions of error cancellation filters 808 and 810 and filter 812 is zero. The polyphase structure performs simple signal processing on multiple phases of the input signal and combines the intermediate outputs to yield the desired output. Decimator 814 can be integrated within the polyphase structure using a clocking scheme wherein the Y1 and Y2 signals are decimated by six before any processing is performed. The pre-decimation allows the registers of the polyphase structure to be operated at a lower clock speed which reduces power consumption.

As shown in FIG. 9A, the Y1 signal is provided to polyphase filters 902*a* and 904*a* and the Y2 signal is provided to polyphase filters 902*b* and 904*b*. In the exemplary embodiment, all registers labeled "A" in FIG. 9A are clocked on the rising edge of a clock ($f_{ADC}/2$) which is half the frequency of the ADC sampling clock, all registers labeled "B" are clocked on the falling edge of the $f_{ADC}/2$ clock, and all registers labeled "C" are clocked on the rising edge of a clock ($f_{ADC}/6$) which is one-sixth the frequency of the ADC sampling clock.

Within polyphase filter 902*a*, Y1 is provided to register 914*a*. The output from register 914*a* is provided to register 914*b* and the output from register 914*b* is provided to register 914*c*. Registers 914 provide three phases of the Y1 signal. The three phases of Y1 from register 914*a*, 914*b*, and 914*c* are provided to filters 912*a*, 912*b*, and 912*c*, respectively. Within filter 912*a*, the output from register 914*a* is provided to register 916*a*, the output from register 916*a* is provided to register 916*b* and gain element 918*a*, the output from register 916*b* is provided to register 916*c* and gain element 918*b*, the output from register 916*c* is provided to register 916*d* and gain element 918*c*, the output from register 916*d* is provided to register 916*e* and gain element 918*d*, the output from register 916*e* is provided to register 916*f* and gain element 918*e*, and the output from register 916*f* is provided to gain element 918*f*. In the exemplary embodiment, the gains of gain elements 918*a*, 918*b*, 918*c*, 918*d*, 918*e*, and 918*f* within filter 912*a* are [0, −8, 45, −21, 7, 0], respectively. Similarly, in the exemplary embodiment, the gains of filter 912*b* are [0, 21, −42, 15, −3, 0], and the gains of filter 912*c* are [2, −35, 33, −10, 1, 0]. In the exemplary embodiment, the gains of the three corresponding filters in polyphase filter 902*b* are [1, −5, −12, −5, 1, 0], [−3, 0, 9, 6, 0, 0], and [6, 9, 0, −3, 0, 0]. The exemplary gains of filter 912*d* are [0, 2, −35, 33, −10, 1], the exemplary gains of filter 912*e* are [0, −8, 45, −21, 7, 0], and the exemplary gains of filter 912*f* are [0, 21, −42, 15, −3, 0]. The exemplary gains of the three filters within polyphase filter 904*b* are [0, 6, 9, 0, −3, 0], [1, −5, −12, −5, 1, 0], and [−3, 0, 9, 6, 0, 0]. The polyphase filters can be implemented such that the coefficients can be rearranged and/or combined to simplify the hardware design. For example, the filter gains of [−3, 0, 9, 6, 0, 0] can be implemented as 3·[−1, 0, 3, 2, 0, 0]. In this case, the data samples corresponding to the −1 and 2 coefficients can be scaled and combined, the resultant sum can be combined with the scaled data sample corresponding to the 3 coefficient, and the overall result scaled by three.

Adder 920*b* receives the outputs from gain elements 918*a* and 918*b*, sums the two signals, and provides the output to adder 920*c*. Adder 920*c* also receives the output from gain element 918*c*, sums the two signals, and provides the output to adder 920*d*. Adder 920*d* also receives the output from gain element 918*d*, sums the two signals, and provides the output of filter 912*a*. The outputs of filters 912*a*, 912*b*, and 912*c* are provided to adder 922*a* which sums the three signals to provide the output of polyphase filter 902*a*. Polyphase filters 902*b* is identical to polyphase filter 902*a*. Polyphase filters 904 are identical to polyphase filters 902 with the exception that the "A" registers 914 in polyphase filter 902 are replaced with the "B" registers 906 in polyphase filter 904.

Polyphase filters 902 and 904 perform most of the functions of error cancellation filters 808 and 810 and bandpass filters 812 in FIG. 8, respectively. The output from polyphase filters 902*b* and 904*b* are provided to gain elements 932*a* and 932*b*, respectively. Each gain element 932 scales the respective output with an exemplary gain of four to account for the gain of error cancellation filter 810. The output from polyphase filter 902*a* and the output from gain element 932*a* are provided to adder 930*a* which sums the two signals. Similarly, the output from polyphase filter 904*a* and the output from gain element 932*b* are provided to adder 930*b* which sums the two signals. The outputs from adders 930*a* and 930*b* comprise the two outputs from the noise cancellation circuit and correspond to the outputs from DEMUX 816 in FIG. 8.

Referring to FIG. 9B, the output from adder 930*a* is provided to multiplexer (MUX) 936*a* and gain element 934*a* which scales the signal with a gain of −1. The output from gain element 934*a* is provided to MUX 936*a*. MUX 936*a* alternatively selects the output from gain element 934*a* and the output from adder 930*a* and effectively performs the function of multiplier 818*a* in FIG. 8. Register 916*g* and inverter 952*a* provides a sequence of alternating ones and zeros [1 0 1 0 . . . ] which is used to control MUX 936*a*. The output from MUX 936*a* is provided to lowpass filter 908 which implements the transfer function of lowpass filter 820 in FIG. 8. Within lowpass filter 908, the output from MUX 936*a* is provided to register 916*e* and adder 920*e*. The output from register 916*e* is provided to register 916*f* and gain element 918*e* which scales the signal with a gain of six. The output from gain element 918*e* is provided to adder 920*e* which sums the two inputs and provides the output to adder 920*f*. The output from register 916*f* is provided to adder 920*f* which sums the two inputs and provides the I output.

The output from adder 930*b* is provided to multiplexer (MUX) 936*b* and gain element 934*b* which scales the signal with a gain of −1. The output from gain element 934*b* is provided to MUX 936*b*. MUX 936*b* alternatively selects the output from gain element 934*b* and the output from adder 930*b* and effectively performs the function of multiplier 818*b* in FIG. 8. The sequence of alternating ones and zeros [1 0 1 0 . . . ] from inverter 952*a* is provided to MUX 954 and inverter 952*b*. The output of inverter 952*b* is provided to MUX 954. MUX 954 implements the function of MUX 824 in FIG. 8 and provides one of two sequence to control MUX 936*b*, depending on the spectral inversion control signal. The output from MUX 936*b* is provided to lowpass filter 910 which implements the transfer function of lowpass filter 822 in FIG. 8. Within lowpass filter 910, the output from MUX 936b is provided to register 916h and adder 920h. The output from register 916h is also provided to adder 920h which sums the two input and provides the output to gain element 938. Gain element 938 scales the signal with a gain of four and provides the Q output.

The present invention has been described for a bandpass sampling receiver utilizing a ΣΔ ADC. For a bandpass receiver, the transfer function of the error cancellation filter is selected accordingly and a bandpass filter is used to filter the quantization noise before the quadrature downconversion. The present invention is also applicable for a baseband receiver utilizing a ΣΔ ADC. For a baseband receiver, the transfer function of the error cancellation filter is modified for the baseband ΣΔ ADC and a lowpass filter is used to filter the quantization noise. The transfer functions of the baseband error cancellation filter and the lowpass filter can be convolved to generate the noise cancellation circuit in similar manner to that described above for the bandpass receiver design. Thus, the adaptation of the inventive concept described above for use in a baseband receiver is within the scope of the present invention.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A noise cancellation circuit comprising:
at least two bandpass decimators, each bandpass decimator comprising an error cancellation filter for receiving a signal from an analog-to-digital converter (ADC) and a filter connected to the error cancellation circuit for filtering an output from the error cancellation filter; and
a summer connected to each of the at least two bandpass decimators for summing the outputs of the bandpass decimators; wherein a transfer function of the error cancellation filter is convolved with a transfer function of the filter to generate a convolved transfer function of the respective bandpass decimator.

2. The noise cancellation circuit of claim 1 wherein the ADC is a sigma-delta ADC.

3. The noise cancellation circuit of claim 2 wherein the ADC is a MASH sigma-delta ADC having two loops.

4. The noise cancellation circuit of claim 3 wherein the ADC is a MASH 4-4 sigma-delta ADC.

5. The noise cancellation circuit of claim 1 wherein the filter is a bandpass filter.

6. The noise cancellation circuit of claim 1 wherein each of the at least one bandpass decimator further comprises a decimator connected to the filter for receiving and decimating an output of the filter.

7. The noise cancellation circuit of claim 6 wherein the decimator decimates by N where N is an positive odd integer.

8. The noise cancellation circuit of claim 6 wherein the decimator decimates by three.

9. The noise cancellation circuit of claim 6 wherein the decimator decimates by five.

10. The noise cancellation circuit of claim 6 wherein the filter is a bandpass filter having a zero placed at one quarter of a sample rate of decimated samples from the decimator.

11. The noise cancellation circuit of claim 10 wherein the bandpass filter is designed with additional zeros placed at $mf_{ADC}/4N$ where N is a decimation factor of the decimator, m is an positive odd integer less than 2N and not equaled to N, and $f_{ADC}$ is a sampling frequency of the ADC.

12. The noise cancellation circuit of claim 1 implemented with a polyphase structure.

13. A quadrature downconverter comprising:
a noise cancellation circuit for receiving at least one output from an analog-to-digital converter (ADC) and providing IF samples;
at least one multiplier connected to the noise cancellation circuit for receiving the IF samples and downconverting the IF samples to baseband samples; wherein the noise cancellation circuit comprises at least one bandpass decimator, each bandpass decimator comprising an error cancellation filter and a filter; and a transfer function of each bandpass decimator is generated by convolving a transfer function of the corresponding error cancellation filter with a transfer function of the filter.

14. The quadrature downconverter of claim 13 wherein the ADC is a sigma-delta ADC.

15. The quadrature downconverter of claim 13 wherein the filter is a bandpass filter.

16. The quadrature downconverter of claim 13 wherein each bandpass decimator further comprises a decimator connected to the filter.

17. The quadrature downconverter of claim 16 wherein the decimator decimates by N where N is an positive odd integer.

18. The quadrature downconverter of claim 13 implemented with a polyphase structure.

19. A quadrature downconverter comprising:
at least two bandpass decimators, one bandpass decimator for each loop of a MASH ΣΔ ADC, each bandpass decimator receiving an output from the corresponding loop;
a summer connected to the bandpass decimators, the summer summing outputs of the bandpass decimators to provide IF samples; and
two multipliers connected to the summer for receiving the IF samples and downconverting the IF samples to baseband samples; wherein each bandpass decimator comprises an error cancellation filter and a filter and a transfer function of each bandpass decimator is generated by convolving a transfer function of the corresponding error cancellation filter with a transfer function of the filter.

20. The quadrature downconverter of claim 19 wherein the filter is a bandpass filter.

21. The quadrature downconverter of claim 19 wherein the bandpass decimator further comprises a decimator connected to the filter.

22. The quadrature downconverter of claim 21 wherein the decimator decimates by N where N is an positive odd integer.

23. The quadrature downconverter of claim 19 further comprising:
one lowpass filter connected to each of the multipliers, the lowpass filters filtering the baseband samples to provide baseband outputs.

24. The digital quadrature downconverter of claim 23 wherein amplitude responses of the lowpass filters are substantially similar.

25. The digital quadrature downconverter of claim 23 wherein a delay response of one lowpass filters is delayed with respect to delays of remaining filters.

26. The quadrature downconverter of claim 19 implemented with a polyphase structure.

* * * * *